United States Patent [19]
Un

[11] 4,032,822
[45] June 28, 1977

[54] ELECTROMAGNETIC FLUSH CONTROL SETUP IN FLUSH TOILET

[76] Inventor: Yee Kyar Un, No.9, Alley 559, Section 2, Fu-Hsin S. Road, Taipei, China /Taiwan

[22] Filed: Dec. 18, 1975

[21] Appl. No.: 641,894

[52] U.S. Cl. .............................. 361/205; 4/DIG. 3; 361/179

[51] Int. Cl.² ....................................... H01H 47/32

[58] Field of Search ....... 317/123, DIG. 2, 148.5 B; 4/100, 59, 64, DIG. 3; 340/258 B, 258 C

[56] References Cited

UNITED STATES PATENTS

| | | | |
|---|---|---|---|
| 3,121,880 | 2/1964 | Gelhar | 4/DIG. 3 X |
| 3,314,081 | 4/1967 | Atkins et al. | 317/DIG. 2 X |
| 3,784,848 | 1/1974 | Hamilton | 317/DIG. 2 X |

Primary Examiner—Harry E. Moose, Jr.

[57] ABSTRACT

An electromagnetic flush control setup employed in a flush toilet comprising an inducing terminal, an amplifier coupled with a trigger circuit, and an electromagnet setting. The inducing terminal is placed beneath the ringed cover of a flush toilet whereby to induce therein, in accordance with the variation of electrostatic field, a small signal which is then amplified, transduced and rectified to drive a relay so as to charge a capacitor from a DC source. And subsequently with vanishing of the signal, the charged capacitor reversely discharges whereby to initiate a SCR making the electromagnet work and exert up the outlet valve of water box. Upon exhaustion of the capacitor, SCR and electromagnet repose thus accomplishing the flush process.

3 Claims, 3 Drawing Figures

ELECTROMAGNETIC FLUSH CONTROL SETUP IN FLUSH TOILET

BACKGROUND OF THE INVENTION

Flush toilet is a daily-using household implement and everybody has much experienced in using it. The disadvantage of a conventional toilet set, which can most easily be seen, is that one has to manually pull the wrench with effort to accomplish the flush process, but he does often forget to do so. Such a disadvantage is rather psychological for one would rather not catch the lousy ordure and water in sight.

Another disadvantage of a known flush toilet is the usual mischief occurred in wrench and interior structure of the water box, resulting in either wasting water or failing to flush.

It is obvious that it would be highly desirable to contrive an automatic flush control setup which makes the user free from caring about the disgusting flush operation. Unfortunately, most past efforts made for this purpose are somewhat limited in the lever mechanism which seriously ruin the esthetic look of a toilet plastic art.

SUMMARY OF THE INVENTION

This invention relates to an electromagnetic flush control setup.

The present invention has successfully overcome all the aforementioned inconveniences and disadvantages.

One object of the invention is to provide an electromagnetic flush control setup which can automatically accomplish the flush process without the necessity of manual operation.

Another aspect of the present invention is to provide an automatic flush control setup which furnishes the house with an absolutely modern implement.

Still another object of the invention is to provide an electromagnetic flush control setup which can remarkably obviate the harassment and mischief occurred in a conventional flush toilet structure.

A further object of the present invention is to provide an electromagnetic flush control setup wherein the flush operation is initiated subject to the time the flush toilet used hereby effectively accomplish the flush without unnecessary waste of water.

According to this invention, an inducing terminal is placed beneath the ringed cover and connected ground-shieldedly to an amplifier. When the flush toilet is in use, a small signal is induced in the inducing terminal and then applied to the amplifier. After being amplified, the signal is rectified and drives the trigger circuit to work thereby to control the SCR either ON or OFF. The state of SCR thus determines the work of electromagnet setting and carries out the flush process.

The invention will be more readily understood by referring to the accompanying drawings.

DETAILED DESCRIPTION OF THE DRAWINGS

DETAILED DESCRIPTION OF THE PREFERRED EMBODIMENT

Figure 1:
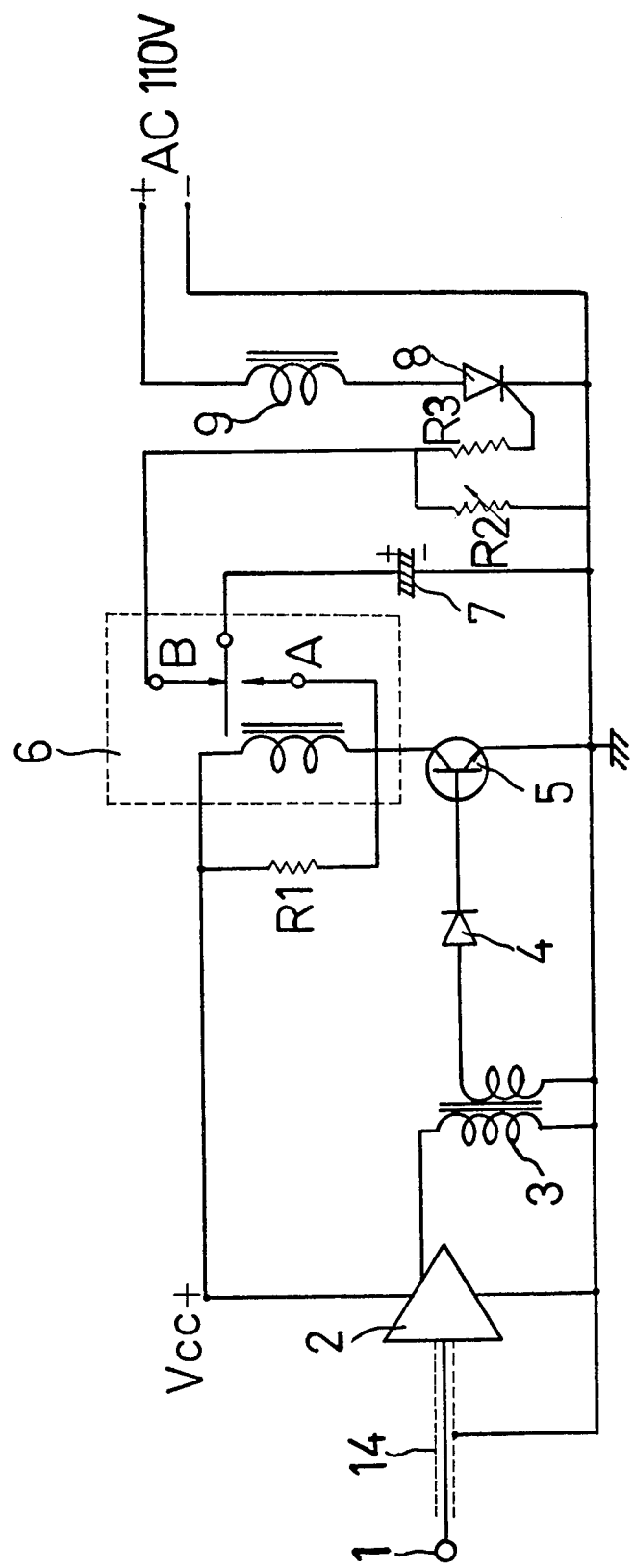
FIG. 1 is a circuit diagram according to the present invention.

Referring to FIG. 1, a circuit diagram according to the invention, the inducing terminal 1 is a bare high conductive metal shaped loop or rod with one end wired ground-shieldedly to the input of the low-frequency amplifier 2. Said amplifier 2 is supplied with a voltage source $Vcc^+$ (12V or 25V) and has its output connected to the primary winding of the low-frequency transformer 3. The signal induced in said inducing terminal 1, amplified by said amplifier and coupled through said transformer 3, is applied to the rectifier 4 (a diode, in general) and then feeded to the base of transistor 5. Said signal at the base of said transistor 5 stage includes a remarkable DC component and accordingly, said transistor is strongly forward biased making the latter at ON state. In this condition, large current flows through the collector of said transistor 5. The collector of said transistor 5 connects a relay 6 as its load which is further wired with a capacitor 7 whereby regulating the charge and discharge period of said capacitor 7 which has its positive end connected through touch point A of said relay 6 to said DC source $Vcc^+$. The positive end of said capacitor 7 is also ready to connect, through touch point B of said relay 6, to the gate of the SCR 8 which has its cathode grounded with the negative end of said capacitor 7 thereof, while the anode of said SCR 8 is wired through the electromagnet coil to an AC power source, i.e., city-electric power source.

Said inducing terminal 1 is properly placed beneath the front part of the ringed cover 20 and connected to the whole electronic circuit with wire shielded by a grounded mesh 14. When a human's body closes to or sits on the flush toilet, variation of the electrostatic field near the toilet is duly incurred thereabout. The detailed operation analysis of the preferred embodiment according to the invention is made hereinbelow.

The said low-frequency amplifier 2 is always supplied with a DC source $Vcc^+$ (12V or 25V). When a human's body closes to said ringed cover 20 (with diameter about 20 cm) which has been equipped thereof with said inducing terminal 1, variation of electro-static field is incurred thereabout and thus induces in said inducing terminal 1 a small signal which is then applied to said low-frequency amplifier 2. Said signal amplified by said amplifier 2, transduced by said transformer 3 and rectified by rectifier 4, is then feeded with remarkable DC component to the base of said transistor 5 whereby strongly forward biasing the said transistor and duly making said transistor 5 at ON state. Hence, large current flows through said relay coil resulting in that the tongue of said relay 6 is exerted to touch point A, and that the DC source $Vcc^+$ is applied to said capacitor 7 through touch point A and charges said capacitor 7 thereof.

When human's body leaves the toilet after using it, signal vanishes in said inducing terminal 1 and there is no output at the secondary winding of said transformer 3 resulting in that said transistor 5 is not forward biased, i.e., at OFF state. Therefore, due to the present situation that no current flows through said relay 6, the tongue in said relay 6 rebounces to touch point B letting said capacitor 7 discharge and initiate said SCR 8. Said SCR 8, being initiated to conduct (in half-wave rectifying condition), thus forms with said electromagnet coil a loop with regard to the 110V AC power source so as to pull up outlet valve 13 of the water box and accomplish flush process. R1 in FIG. 1. is employed to elongate the charging time of said capacitor 7 whereby avoiding unnecessary flush caused by the presence of unintentional instant signal induced in said inducing terminal 1. R2 is an adjustable discharging resistor in order to regulate the discharging time and R3 is a current-limiting resistor.

Figure 2:
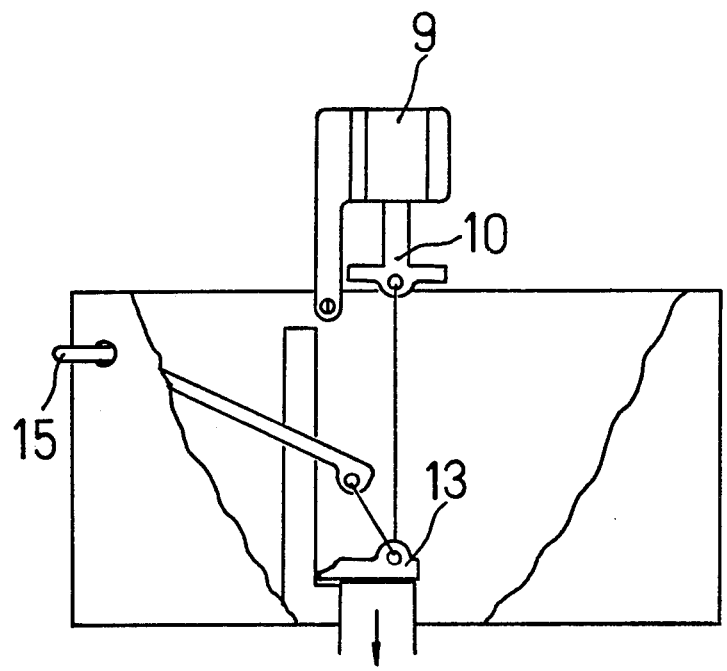
FIG. 2 shows schematically the situation of the electromagnet setting and the interior structure of the water box according to the present invention.
Figure 3:
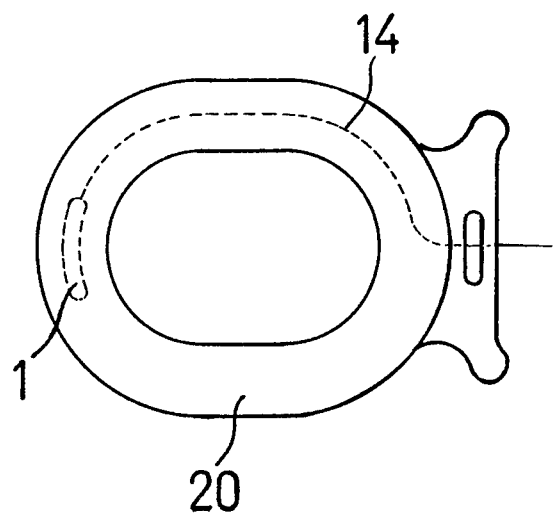
FIG. 3 shows schematically an inducing terminal placed beneath the ringed cover of a preferred flush toilet according to the present invention.

Referring to FIG. 2, the electromagnet setting in the invention is placed above the water box and includes a magnet tongue which is connected with said outlet valve 13 by a thread. Hence, when said electromagnet attracts said magnet tongue, the latter pulls up said outlet valve 13 thereby starting in to flush. But when said capacitor 7 exhausts and no more current flows into gate of said SCR 8, said SCR 8 shuts the electromagnet circuit so that magnet tongue 10 swoops whereby closing said outlet valve 13 and simultaneously, conserving water with floating ball or other conventional method.

As shown in FIG. 2, said outlet valve 13 according to the present invention still does not discard the conventional connection with the wrench 15. Therefore, should the power go off, the embodiment of the invention can also be manually controlled.

Power consumption of the invention is rather small. Power consumed for supplying incessantly said low-frequency amplifier 2 with 12V or 25V DC source (Vcc+ does not excess 25 mW, while said transistor 5, said relay 6 and said capacitor 7 draw power only when in operation, i.e., a human's body closes to or sits on said ringed cover 20. Furthermore, said electromagnet setting which is supplied with 110V AC power source consumes, only during a short period for discharge of said capacitor 7, about 10W power thereof and, reposes again upon the exhaustion of said capacitor 7. Therefore, the invention certainly does not raise the power consumption record of a house or building.

What I claim is:

1. An electromagnet flush control setup for use in a flush toilet comprising:
an inducing terminal made of conductive metal;
an amplifier for amplifying a signal induced in said inducing terminal;
a transformer having a primary and a secondary winding, said primary winding connected to the output of said amplifier;
a rectifier having a first end connected to said secondary winding;
a transistor having a base lead connected to the second end of said rectifier, whereby said transistor is biased to an on state by the presence of a signal at said inducing terminal;
a D.C. power source;
a relay connected in series with said D.C. source and said transistor, whereby said transistor being in an on state causes said relay to move from a first position to a second position;
a capacitor connected to be charged by said D.C. source when said relay is in said second position;
an SCR having its gate connected to said capacitor when said relay is in said first position;
an A.C. power source;
an electromagnet coil connected in series with said A.C. source and said SCR, whereby said capacitor discharges through said SCR when said relay moves back to said first position, causing said SCR to conduct and energize said coil;
flush means activated by said coils to flush the toilet, whereby the presence of a human body on the toilet provides said signal in the inducing terminal and thereby causes said capacitor to be charged, and the termination of said signal causes said coils to be energized and the toilet to be flushed.

2. The control setup as claimed in claim 1, wherein said inducing terminal is placed beneath the ringed cover of a flush toilet, and one end of said inducing terminal is connected to said amplifier by a shielded wire.

3. The control setup as claimed in claim 1, wherein said electromagnet coil is situated above the water box of a flush toilet, and said flush means includes a magnet tongue connected with the outlet valve of the water box.

* * * * *